United States Patent [19]
Sato et al.

[11] Patent Number: 5,948,589
[45] Date of Patent: *Sep. 7, 1999

[54] POSITIVE-WORKING PHOTORESIST COMPOSITION

[75] Inventors: Kazufumi Sato, Sagamihara; Kazuyuki Nitta, Kanagawa-ken; Akiyoshi Yamazaki, Yokohama; Yoshika Sakai, Atsugi; Toshimasa Nakayama, Chigasaki, all of Japan

[73] Assignee: Tokyo Ohka Kogyo Co., Ltd., Japan

[ * ] Notice: This patent is subject to a terminal disclaimer.

[21] Appl. No.: 08/658,234

[22] Filed: Jun. 4, 1996

[30] Foreign Application Priority Data

Jun. 15, 1995 [JP] Japan .................................. 7-172899

[51] Int. Cl.⁶ ................................................ G03F 7/004
[52] U.S. Cl. ....................... 430/270.1; 430/170; 430/905
[58] Field of Search ............................... 430/170, 270.1, 430/905

[56] References Cited

U.S. PATENT DOCUMENTS

| | | | |
|---|---|---|---|
| 4,491,628 | 1/1985 | Ito et al. | 403/270.1 |
| 5,225,316 | 7/1993 | Vogel et al. | 430/270.1 |
| 5,340,682 | 8/1994 | Pawlowski et al. | 430/270.1 |
| 5,374,500 | 12/1994 | Carpenter, Jr. et al. | 430/270.1 |
| 5,403,695 | 4/1995 | Hayase et al. | 430/270.1 |
| 5,512,417 | 4/1996 | Ban et al. | 430/270.1 |
| 5,633,112 | 5/1997 | Miwa et al. | 430/270.1 |
| 5,658,706 | 8/1997 | Niki et al. | 430/270.1 |
| 5,736,296 | 4/1998 | Sato et al. | 430/270.1 |
| 5,770,343 | 6/1998 | Sato et al. | 430/270.1 |

FOREIGN PATENT DOCUMENTS

| | | |
|---|---|---|
| 0 537 524 | 4/1993 | European Pat. Off. . |
| 0 558 280 | 9/1993 | European Pat. Off. . |
| 5-127369 | 5/1993 | Japan . |
| 5-289322 | 11/1993 | Japan . |
| 6-317902 | 11/1994 | Japan . |
| 7-92678 | 4/1995 | Japan . |
| 7-92679 | 4/1995 | Japan . |
| 7-120929 | 5/1995 | Japan . |

OTHER PUBLICATIONS

Funhoff et al., "An Environmentally Stable Chemical Amplified Deep–UV Resist", Journal of Information Recording Materials, vol. 21, No. 4, 1994, pp. 311–320.

*Primary Examiner*—John S. Chu
*Attorney, Agent, or Firm*—Wenderoth, Lind & Ponack, L.L.P.

[57] ABSTRACT

Proposed is an improved chemical sensitization-type positive-working photoresist composition of high sensitivity and high pattern resolution for the photolithographic patterning works in the manufacture of semiconductor devices, which exhibits excellent post-exposure stability of the latent image formed by the pattern-wise exposure of the resist layer to actinic rays not to be affected relative to the fidelity of pattern reproduction and sensitivity even by standing for a length of time after the exposure to actinic rays before the subsequent processing treatment. The composition is characterized by the formulation of, in addition to an acid generating compound to release an acid by the irradiation with actinic rays and a resinous ingredient capable of being imparted with increased solubility in an aqueous alkaline developer solution by the presence of an acid, an amine compound such as triethylamine and a carboxylic acid such as salicylic acid in combination.

8 Claims, No Drawings

POSITIVE-WORKING PHOTORESIST COMPOSITION

BACKGROUND OF THE INVENTION

The present invention relates to a positive-working photoresist composition used in the photolithographic fine patterning works in the manufacture of semiconductor devices and the like in the electronics industry or, more particularly, to a positive-working photoresist composition of high sensitivity and high resolution capable of exhibiting high stability of the latent images formed by the pattern-wise exposure of the resist layer to actinic rays before the post-exposure baking (PEB) treatment.

As is well known, the photolithographic fine patterning work is a well established technology in the manufacture of various kinds of semiconductor devices such as ICs, LSIs and the like by using a photoresist composition. Namely, a photoresist layer of a photoresist composition is formed on the surface of a substrate such as a semiconductor silicon wafer and the photoresist layer is exposed pattern-wise to actinic rays through a pattern-bearing photomask to form a latent image of the pattern in the resist layer followed by a development treatment to form a patterned resist layer which serves as a protective layer in the processing of the substrate surface by an etching treatment or other means. The photoresist composition of the most conventional type is the positive-working photoresist composition comprising an alkali-soluble novolac resin as a film-forming agent and a naphthoquinonediazide group-containing compound as a photosensitizing agent.

Along with the rapid progress in recent years in the semiconductor technology toward a higher and higher degree of integration of the semiconductor devices with corresponding fineness in the patterning works leading to a submicron or quater-micron order of fineness in the photolithographic patterning for the manufacture of VLSIs and the like, the wavelength of the actinic rays used for the pattern-wise exposure of the photoresist layer should be shorter and shorter to shift from the so-called g-line to the wavelength regions of the so-called i-line and deep ultraviolet light and further to excimer laser beams such as KrF laser beams and so on. Deep ultraviolet light and excimer laser beams are used as a major current of the actinic rays for the pattern-wise exposure of resist layers in the photolithographic patterning works.

Conventional photoresist compositions comprising a novolac resin and a quinonediazide group-containing compound developed for use with g-line and i-line ultraviolet lights are not suitable for use with deep ultraviolet light or excimer laser beams due to the large absorptivity of ultra-violet having a shorter wavelength than g-line and i-line so that the so-called chemical sensitization-type photoresist compositions are now highlighted by virtue of the smaller ultraviolet absorption by the poly(hydroxystyrene)-based resin as the film-forming agent therein.

The above mentioned chemical sensitization-type photoresist composition utilizes a principle that the acid-generating agent contained therein as an essential ingredient releases an acid when the resist layer is pattern-wise exposed to actinic rays and the thus released acid catalytically acts on the resinous ingredient to alter the solubility thereof in a developer solution. Characteristically, the chemical sensitization-type photoresist compositions are advantageous in respects of their high pattern resolution and high sensitivity to actinic rays because even a small amount of an acid generated from the acid-generating agent exhibits a catalytic activity on the resinous ingredient. The chemical sensitization-type photoresist compositions can be classified into two classes of the positive-working photoresist compositions, in which the resinous ingredient is imparted with increased solubility in an aqueous alkaline solution as the developer solution by the catalytic activity of an acid, and negative-working photoresist compositions, which comprises an acid-generating agent, alkali-soluble resinous ingredient and crosslinking agent so that crosslinking of the resinous ingredient by the crosslinking agent is promoted by the acid generated by the irradiation with actinic rays to decrease the solubility of the resinous ingredient in a developer solution.

In view of the mechanism for the formation of a latent image by the activity of an acid released from the acid-generating agent on the solubility-reducing substituent groups in the resinous ingredient, a proposal is made for a chemical sensitization-type positive-working photoresist composition that an acid-capturing agent such as an amine compound is admixed in the composition with an object to prevent diffusion of the acid released from the acid-generating agent by the irradiation with actinic rays so as to improve the performance of the photoresist composition (see, for example, Japanese Patent Kokai 5-127369, 5-232706, 5-249662, 5-289322, 6-317902, 7-92678 and 7-120929).

Although addition of an amine compound with a chemical sensitization-type positive-working photoresist composition is in fact effective to some extent for the improvement of the pattern resolution, the effectiveness thereby is still insufficient to meet the fineness requirement in the patterning works for the manufacture of semiconductor devices of an extremely high degree of integration such as 64 megabits to 1 gigabit if not to mention the problem of an inherent decrease in the photosensitivity.

An alternative proposal is made in Japanese Patent Kokai 5-181279 and 7-92679 to admix the composition with a carboxylic acid compound with an object to increase the photosensitivity of the composition and to improve the cross sectional profile of the patterned resist layer obtained from the composition. This proposal, however, is not practicable because the improvement in the cross sectional profile of the patterned resist layer is insufficient in addition to the problem of a decrease in the pattern resolution.

Besides, a trouble is sometimes encountered in the photolithographic patterning of a resist layer that the patterned resist layer has a cross sectional profile which is not orthogonal but has trailing skirts, especially, when the substrate surface is provided with a high-reflectivity coating film of silicon nitride, titanium nitride, aluminum-silicon-copper alloys, tungsten and the like so that development is eagerly desired for a chemical sensitization-type positive-working photoresist composition which is not affected by such an undercoating thin film on the substrate surface.

SUMMARY OF THE INVENTION

The present invention accordingly has an object to provide a novel and improved chemical sensitization-type positive-working photoresist composition of high sensitivity and high resolution which is free from the adverse influences by the admixture of an amine compound mentioned above and capable of exhibiting high post-exposure stability of the latent image even by a prolonged standing of the resist layer after the pattern-wise exposure of the resist layer to actinic rays before the PEB treatment not to cause a deterioration in the cross sectional profile of the patterned resist layer so as to give a patterned resist layer of high fidelity to the photomask pattern.

Thus, the chemical sensitization-type positive-working photoresist composition, which is in the form of a uniform solution in an organic solvent, comprises:

(a) an acid-generating agent which is a compound capable of releasing an acid when irradiated with actinic rays;

(b) a resinous compound capable of being imparted with increased solubility in an aqueous alkaline solution in the presence of an acid;

(c) an amine compound; and (d) a carboxylic acid compound.

In particular, the amine compound as the component (c) is an aliphatic amine compound and the amount thereof is in the range from 0.01 to 1% by weight based on the amount of the component (b) while the carboxylic acid compound as the component (d) is preferably an aromatic carboxylic acid compound and the amount thereof is in the range from 0.01 to 5% by weight based on the amount of the component (b).

DETAILED DESCRIPTION OF THE PREFERRED EMBODIMENTS

As is understood from the above given description, the most characteristic feature in the inventive chemical sensitization-type positive-working photoresist composition is the combined admixture of an amine compound as the component (c) and a carboxylic acid compound as the component (d) to a composition comprising an acid-generating agent as the component (a) and a resinous ingredient to be imparted with increased alkali solubility in the presence of an acid as the component (b), although, as is mentioned above, separate admixture of an amine compound alone or a carboxylic acid compound alone is known in the prior art. This unique formulation of the photoresist composition has been developed on the base of an unexpected discovery by the inventors that the problems and disadvantages in the amine-admixed chemical sensitization-type positive-working photoresist composition can be overcome by the combined addition of a carboxylic acid compound with the amine compound so as to give a photoresist composition of high sensitivity and high resolution capable of giving a patterned resist layer having an orthogonal cross sectional profile with high fidelity to the photomask pattern.

The acid-generating agent as the component (a) and the resinous ingredient as the component (b) are each rather conventional and can be freely selected from those conventionally formulated in chemical sensitization-type positive-working photoresist compositions without particular limitations.

The acid-generating agent as the component (a) is exemplified by several classes of compounds including:

i) bis(sulfonyl)diazomethane compounds such as bis(p-toluenesulfonyl)diazomethane, methylsulfonyl p-toluenesulfonyl diazomethane, cyclohexylsulfonyl 1,1-dimethylethylsulfonyl diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane, bis(4-tert-butylphenylsulfonyl)diazomethane and the like;

ii) sulfonyl carbonyl alkane compounds such as 2-methyl-2-(p-toluenesulfonyl)propiophenone, 2-cyclohexylcarbonyl-2-(p-toluenesulfonyl)propane, p-methylthiophenyl(1-methanesulfonyl-1-methyl)ethyl ketone, 2,4-dimethyl-2-(p-toluenesulfonyl)pentan-3-one and the like;

iii) sulfonyl carbonyl diazomethane compounds such as p-toluenesulfonyl cyclohexylcarbonyl diazomethane, 1-diazo-1-methylsulfonyl-4-phenyl-2-butanone, cyclohexylcarbonyl cyclohexylsulfonyl diazomethane, 1-cyclohexylsulfonyl-1-diazo-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-benzenesulfonyl-1-diazo-3,3-dimethyl-2-butanone, 1-diazo-1-(p-toluenesulfonyl)-3-methyl-2-butanone, 2-diazo-2-(p-toluenesulfonyl)cyclohexyl acetate, 2-benzenesulfonyl-2-diazo tert-butyl acetate, 2-diazo-2-methanesulfonyl isopropyl acetate, 2-benzenesulfonyl-2-diazo cyclohexyl acetate, 2-diazo-2-(p-toluenesulfonyl)tert-butyl acetate and the like;

iv) nitrobenzyl sulfonate compounds such as 2-nitrobenzyl p-toluene-sulfonate, 2,6-dinitrobenzyl p-toluenesulfonate, 2,4-dinitrobenzyl p-trifluoromethylbenzenesulfonate and the like; and v) esters of a polyhydroxy compound and an aliphatic or aromatic sulfonic acid such as pyrogallol methanesulfonates, pyrogallol benzenesulfonates, pyrogallol p-toluenesulfonates, pyrogallol p-methoxybenzenesulfonates, pyrogallol mesitylenesulfonates, pyrogallol benzylsulfonates, esters of an alkyl gallate and methanesulfonic acid, esters of an alkyl gallate and benzenesulfonic acid, esters of an alkyl gallate and p-toluenesufonic acid, esters of an alkyl gallate and p-methoxybenzene sulfonic acid, esters of an alkyl gallate and mesitylene sulfonic acids, esters of an alkyl gallate and benzylsulfonic acid and the like. The alkyl group forming the above mentioned alkyl gallate has 1 to 15 carbon atoms and is preferably an octyl or lauryl group.

Besides, vi) onium salts such as bis(p-tert-butylphenyl) iodonium trifluoromethane sulfonate, triphenylsulfonium trifluoromethane sulfonate and the like can also be used as the component (a). Among the above named compounds, particularly preferable are the bis(sulfonyl)diazomethane compounds of which bis(cyclohexylsulfonyl)diazomethane and bis(2,4-dimethylphenylsulfonyl)diazomethane are more preferable. These compounds can be used either singly or as a combination of two kinds or more according to need.

The component (b), which is imparted with increased solubility in an aqueous alkaline solution in the presence of an acid, can also be selected from the synthetic resins conventionally formulated in a chemical sensitization-type positive-working photoresist composition. Examples of such a resinous ingredient include poly(hydroxystyrene)-based resins, of which the hydrogen atoms of the hydroxy groups in a poly(hydroxystyrene) resin are at least partly substituted by certain protective groups having susceptibility to the attack of an acid. Examples of such a protective substituent group include tert-butoxycarbonyl group, tert-butyl group and tert-amyloxycarbonyl group as well as acetal groups such as alkoxyalkyl groups, tetrahydropyranyl group, tetrahydrofuranyl group and the like.

The above mentioned poly(hydroxystyrene)-based resin suitable as the component (b) can be prepared by the copolymerization of a hydroxystyrene monomer and a substituted hydroxystyrene monomer having one of the above named protective groups substituting for the hydrogen atom of the hydroxy group by a known method of polymerization or, alternatively, by a polymer reaction in which the above named protective groups are introduced into a poly (hydroxystyrene) resin to substitute for a part of the hydrogen atoms of the hydroxy groups. In particular, disclosures are found in Japanese Patent Kokai 2-209977 for a copolymer of a tert-butoxycarbonyloxy styrene and p-hydroxystyrene, in Japanese Patent Kokai 2-19847 for a copolymer of p-tetra-hydropyranyloxy styrene and p-hydroxystyrene, in Japanese Patent Kokai 2-62544 for a copolymer of a tert-butoxystyrene and p-hydroxystyrene, in Japanese Patent Kokai 3-282550 for a poly (hydroxystyrene)-based resin having acetal groups as the protective groups, in Japanese Patent Kokai 5-249682 for a poly(hydroxystyrene)-based resin having alkoxyalkyl groups as the protective groups and so on. These poly (hydroxystyrene)-based resins can be used either singly or as a combination of two kinds or more according to need.

A particularly preferable resinous ingredient as the component (b) is a combination of a first poly(hydroxystyrene)-based resin, which is a poly(hydroxystyrene) resin substituted by tert-butoxycarbonyl groups for from 10 to 60% or, preferably, from 20 to 50% of the hydrogen atoms of the hydroxy groups, and a second poly(hydroxystyrene)-based resin, which is a poly(hydroxystyrene) resin substituted by alkoxyalkyl groups for from 10 to 60% or, preferably, from 20 to 50% of the hydrogen atoms of the hydroxy groups, in a weight proportion in the range from 10:90 to 70:30 or, preferably, from 20:80 to 50:50. The above mentioned alkoxyalkyl group, of which the alkoxy group and alkyl group each have 1 to 4 carbon atoms, is exemplified by 1-methoxyethyl, 1-ethoxyethyl, 1-n-propoxyethyl, 1-isopropoxyethyl, 1-n-butoxyethyl, 1-isobutoxyethyl, 1-(1, 1-dimethylethoxy)-1-methylethyl, 1-methoxy-1-methylethyl, 1-ethoxy-1-methylethyl, 1-n-propoxy-1-methylethyl, 1-isobutoxy-1-methylethyl, 1-methoxy-n-propyl and 1-ethoxy-n-propyl groups, of which 1-ethoxyethyl and 1-methoxy-n-propyl groups are preferred in respect of the good balance between the sensitivity and pattern resolution. In the component (b) of this type, the acid generated from the component (a) attacks the tert-butoxycarbonyl groups in the first resin and the alkoxyalkyl groups in the second resin to cause dissociation thereof so that a good balance is established between the alkali solubility of the resinous ingredient and the solubility-suppressing effect by the tert-butoxycarbonyl groups resulting in high sensitivity and high resolution of the resist composition and high heat resistance of the patterned resist layer.

The above mentioned first poly(hydroxystyrene)-based resin can be obtained according to a known reaction of di-tert-butyl dicarbonate and the like with a poly (hydroxystyrene) resin to substitute tert-butoxycarbonyl groups for a part of the hydrogen atoms of the hydroxy groups. When the degree of substitution thereby is too low, the patterned resist layer formed from the composition formulated with such a resin does not have an excellently orthogonal cross sectional profile while, when the degree of substitution is too high, the photoresist composition suffers from a decrease in the sensitivity. The above mentioned second poly(hydroxystyrene)-based resin can be obtained according to a known reaction of 1-chloro-1-ethoxy ethane, 1-chloro-1-methoxy propane and the like with a poly (hydroxystyrene) resin to substitute the respective alkoxyalkyl groups for a part of the hydrogen atoms of the hydroxy groups. When the degree of substitution thereby is too low, the patterned resist layer formed from the composition formulated with such a resin does not have an excellently orthogonal cross sectional profile while, when the degree of substitution is too high, the photoresist composition suffers from a decrease in the sensitivity.

It is preferable that the resinous ingredient as the component (b) has a weight-average molecular weight in the range from 3000 to 30000 as determined by the gel permeation chromatographic method making reference to polystyrene resins having known molecular weights. A photoresist composition prepared by using a resinous ingredient having a molecular weight smaller than the above mentioned lower limit cannot exhibit good film-forming behavior while, when the molecular weight of the component (b) is too large, a decrease is caused in the alkali solubility of the resist layer in an aqueous alkaline developer solution.

The amount of the component (a) in the inventive photoresist composition is in the range from 1 to 20 parts by weight or, preferably, from 2 to 10 parts by weight per 100 parts by weight of the component (b). When the amount of the component (a) is too small, the desired effect of chemical sensitization cannot be fully exhibited as a matter of course while, when the amount thereof is too large, difficulties are encountered in the preparation of a uniform solution by dissolving the ingredients in an organic solvent to prepare a photoresist composition.

The component (c) used as one of the essential ingredients in the inventive photoresist composition is an amine compound used in the photoresist compositions of the prior art and can be selected from aliphatic amine compounds, aromatic amine compounds and heterocyclic amine compounds without particular limitations. Aliphatic amines include dimethyl amine, trimethyl amine, ethyl amine, diethyl amine, triethyl amine, n-propyl amine, di-n-propyl amine, tri-n-propyl amine, isopropyl amine and the like; aromatic amines include benzyl amine, aniline, N-methyl aniline, N,N-dimethyl aniline, o-methyl aniline, m-methyl aniline, p-methyl aniline, N,N-diethyl aniline, diphenyl amine, di-p-tolyl amine and the like; heterocyclic amines include pyridine, o-methyl pyridine, o-ethyl pyridine, 2,3-dimethyl pyridine, 4-ethyl-2-methyl pyridine, 3-ethyl-4-methyl pyridine and the like, of which those having strong basicity and low boiling point are preferred including aliphatic amines such as dimethyl amine, trimethyl amine, ethyl amine, diethyl amine, triethyl amine and the like.

Although these amine compounds named above can be used either singly or as a combination of two kinds or more according to need, it is preferable to use triethylamine alone as the component (c) in respect of the good post-exposure stability of the latent image and excellent cross sectional profile of the patterned resist layer obtained from the photoresist composition.

The amount of the component (c) compounded in the inventive photoresist composition is usually in the range from 0.01 to 1% by weight or, preferably, from 0.05 to 0.5% by weight based on the amount of the component (b). The amine compound as the component (c) contained in the inventive photoresist composition serves to prevent undue diffusion of the acid generated from the acid generating agent as the component (a) when the resist layer formed on the surface of a substrate is exposed pattern-wise to actinic rays so as to enhance the fidelity of the resist patterning to the photomask pattern and also increase the pattern resolution and post-exposure stability of the latent image of the pattern. When the amount of the component (c) is too small, the above mentioned desirable effects cannot be fully obtained as a matter of course while, when the amount thereof is too large, a decrease is caused in the photosensitivity of the resist layer of the composition to actinic rays.

As is mentioned before, the most characteristic feature of the inventive photoresist composition is admixture of a carboxylic acid as the component (d) in combination with the amine compound as the component (c). Though not particularly limitative, the carboxylic acid can be selected from saturated or unsaturated aliphatic carboxylic acids, alicyclic carboxylic acids, oxy carboxylic acids, alkoxy carboxylic acids, keto carboxylic acids, aromatic carboxylic acids and others. The saturated aliphatic carboxylic acid is exemplified by monobasic- and polybasic caboxylic acids such as formic acid, acetic acid, propionic acid, butyric acid, isobutyric acid, oxalic acid, malonic acid, succinic acid, glutaric acid, adipic acid and the like. The unsaturated aliphatic carboxylic acid is exemplified by acrylic acid, crotonic acid, isocrotonic acid, 3-butenoic acid, methacrylic acid, 4-pentenoic acid, 2-butynoic acid, maleic acid, fumaric acid, acetylene carboxylic acids and the like. The alicyclic carboxylic acid is exemplified by 1,1-cyclohexane dicarboxylic acid, 1,2-cyclohexane dicarboxylic acid, 1,3-cyclohexane dicarboxylic acid, 1,4-cyclohexane dicarboxylic acid, cyclohexane 1,1-diacetic acid and the like. The oxy carboxylic acid is exemplified by glycolic acid and the like. The alkoxy carboxylic acid is exemplified by methoxy acetic acid, ethoxy acetic acid and the like. The keto carboxylic acid is exemplified by pyruvic acid and the like. The aromatic carboxylic acid, which may be substituted by a hydroxyl group, nitro group, vinyl group and the like, is exemplified by benzoic acid, 4-hydroxy benzoic acid, 2-hydroxy benzoic acid, i.e. salicylic acid, 2-hydroxy-3-nitro benzoic acid, 3,5-dinitro benzoic acid, 2-nitro benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid, 2-vinyl benzoic acid, 4-vinyl benzoic acid, phthalic acid, terephthalic acid, isophthalic acid and the like.

Among the above named carboxylic acid compounds, in particular, aromatic carboxylic acids are preferred in respect of their adequate acidity and low volatility. Salicylic acid is most preferable in respect of its good compatibility with the other ingredients and solvents of the composition as well as good adaptability to various kinds of substrate materials to form a satisfactory patterned resist layer.

The amount of the carboxylic acid as the component (d) compounded in the inventive photoresist composition is usually in the range from 0.01 to 5% by weight or, preferably, from 0.05 to 2.0% by weight based on the amount of the component (b). Further, it is preferable that the amount of the component (d) is in the range from twice to 20 times by weight of the amount of the amine compound as the component (c). The carboxylic acid compound as the component (d) contained in the inventive photoresist composition serves to prevent an undue decrease in the photosensitivity of the composition due to the component (c) and also to increase the pattern resolution along with an improving effect in the adaptability of the resist composition to various kinds of substrates to give a satisfactory patterned resist layer. When the amount of the component (d) is too small, the above mentioned desirable effects cannot be fully obtained as a matter of course while, when the amount thereof is too large, an adverse influence is caused in the film thickness reduction by the development treatment in the areas unexposed to actinic rays. Though not well understood, the mechanism by which the above described advantageous effects can be obtained by the admixture of an acid as the component (d) is presumably due to the buffering action between the weak acid as the component (d) and the strong base as the component (c).

The photoresist composition of the invention is used usually in the form of a solution prepared by uniformly dissolving the above described essential ingredients and other optional additives, such as auxiliary resins, plasticizers, stabilizers, coloring agents, surfactants and the like to improve the properties of the resist layer, in an organic solvent. Examples of suitable organic solvents include acetone, methyl ethyl ketone, cyclohexanone, methyl isoamyl ketone and 2-heptanone as the examples of ketone compounds, polyhydric alcohols, e.g., ethyleneglycol, propyleneglycol, diethyleneglycol and dipropyleneglycol, and derivatives thereof such as monoalkyl, e.g., monomethyl, monoethyl, monopropyl and monobutyl, or monophenyl ethers as well as monoalkyl or monophenyl ether monoacetates, dioxane as the example of cyclic ether compounds and methyl lactate, ethyl lactate, methyl acetate, ethyl acetate, butyl acetate, methyl pyruvate, ethyl pyruvate, methyl methoxypropionate and ethyl ethoxypropionate as the examples of ester compounds. These organic solvents can be used either singly or as a mixture of two kinds or more according to need. The concentration of the solution relative to the dissolved ingredients can be selected according to the thickness of the resist layer formed from the composition and other factors.

The procedure of the photolithographic patterning works by the use of the inventive positive-working photoresist composition can be generally the same as the procedures by using a conventional photoresist composition. For example, a substrate such as a semiconductor silicon wafer is coated with the inventive photoresist composition in the form of a solution by using a suitable coating machine such as a spinner followed by drying to form a dried photoresist layer which is exposed pattern-wise to actinic rays such as deep ultraviolet light, excimer laser beams and the like through a pattern-bearing photomask on a minifying projection exposure machine to form a latent image of the pattern followed by a post-exposure baking treatment. Thereafter, the latent image formed in the resist layer is developed by using an aqueous alkaline solution such as an aqueous solution of tetramethylammonium hydroxide in a concentration of 1 to 10% by weight to dissolve away the resist layer in the areas exposed to the actinic rays so that a patterned resist layer having high fidelity to the photomask pattern can be obtained. By virtue of the unique formulation of the inventive photoresist composition which is of the chemical sensitization type, the photoresist composition of the invention exhibits excellent post-exposure stability of the latent image in the resist layer or, namely, stability of the latent image kept standing prolongedly after exposure to actinic rays before the post-exposure baking treatment to greatly improve the workability of the photolithographic patterning process along with high pattern resolution and high photosensitivity.

In the following, the positive-working photoresist composition of the invention is described in more detail by way of examples, in which the photoresist compositions were evaluated for the following items by the testing procedures respectively described there. The term of "parts" in the formulation of the compositions always refers to "parts by weight".

(1) Photosensitivity

A silicon wafer was coated with the photoresist composition in the form of a solution by using a spinner followed by drying for 90 seconds on a hot plate kept at 90° C. to give a uniform resist layer of the composition having a thickness of 0.7 μm. The thus formed resist layer was exposed patternwise to ultraviolet light on a minifying projection exposure machine (Model NSR-2005EX8A, manufactured by Nikon Co.) with an exposure dose varied stepwise with 1 mJ/cm$^2$ increments followed by a post-exposure baking treatment at 110° C. for 90 seconds and a development treatment in a 2.38% by weight aqueous solution of tetramethylammonium hydroxide at 23° C. for 60 seconds to give a patterned resist layer after rinse with running water for 30 seconds and drying. Recording of the photosensitivity was made for the minimum exposure dose by which the residual film thickness in the areas exposed to light was substantially zero after development.

(2) Pattern resolution

Recording was made for the critical line width resolved at an exposure dose by which resolution could be obtained for a line-and-space pattern of 0.25 μm line width.

(3) Fidelity to photomask pattern

Patterning of a line-and-space pattern of 0.25 μm line width was performed in the same manner as in (1) above and recording was made in three ratings of "A", "B" and "C" according to the following criteria.

A: good pattern reproduction with high fidelity to the photomask pattern

B: slight narrowing detected in patterned lines

C: noticeable narrowing detected in patterned lines (4) Adaptability to substrate surfaces The photolithographic patterning work was conducted in substantially the same manner as in (1) above to form a line-and-space pattern of the resist layer having a line width of 0.25 μm on three silicon wafers having respectively different surface coating layers of silicon nitride, titanium nitride and BPSG insulation, referred to as substrate S-I, S-II and S-III, respectively. The cross sectional profile of the patterned resist layer was examined with a scanning electron microscope to record the results as "A" for an orthogonal cross sectional profile and "B" for a cross sectional profile having trailing skirts.

(5) Post-exposure stability

The procedure down to the pattern-wise exposure of the resist layer to light for a line-and-space pattern of 0.25 μm line width was substantially the same as in (1) above for the test of sensitivity but the pattern-wise exposed resist layer was kept standing for 60 minutes at room temperature before the post-exposure baking treatment and development. The thus obtained patterned resist layer was examined with a scanning electron microscope for the cross sectional profile to record the results in two ratings of "A" for a pattern with good fidelity to the photomask pattern relative to the width of the patterned line and orthogonality of the cross section and "B" for a pattern having an apparently smaller width than the photomask pattern.

EXAMPLE 1

A positive-working photoresist composition was prepared by dissolving, in 490 parts of propyleneglycol monomethyl ether acetate, 30 parts of a first poly(hydroxystyrene)-based resin having a weight-average molecular weight of 10000 and having tert-butyloxycarbonyloxy groups substituting for 39% of the hydroxy groups in a poly(hydroxystyrene) resin, 70 parts of a second poly(hydroxystyrene)-based resin having a weight-average molecular weight of 10000 and having ethoxyethoxy groups substituting for 39% of the hydroxy groups in a poly(hydroxystyrene) resin, 7 parts of bis(cyclohexylsulfonyl)diazomethane, 0.1 part of triethylamine and 0.5 part of salicylic acid followed by filtration of the solution through a membrane filter having a pore diameter of 0.2 μm.

The results obtained in the evaluation tests of this photoresist composition are shown in Table 1 below.

EXAMPLES 2 TO 5 AND COMPARATIVE EXAMPLES 1 TO 3

The experimental procedure in each of these Examples and Comparative Examples was substantially the same as in Example 1 described above except that the amine compound and/or carboxylic acid compound as well as the amounts of addition thereof were modified or omitted in some cases as shown in Table 1. The results obtained in the evaluation tests of these photoresist compositions are shown in Table 1 below. It was noted that the film thickness reduction was large in the unexposed areas in Comparative Example 3.

In Table 1 below, the names of the amine compounds and carboxylic acid compounds are abridged as shown below and the numerical values given in brackets show the amount of the amine or carboxylic acid compound in part added to the composition.

TEA: triethylamine

TMA: trimethylamine

DMA: dimethylamine

SA: salicylic acid

NBA: nitrobenzoic acid

PA: phthalic acid

TABLE 1

|  | Amine (parts) | Carboxylic acid (parts) | Sensitivity, mJ/cm$^2$ | Pattern resolution, μm | Fidelity to mask pattern | Adaptability to substrate | Post-exposure stability |
|---|---|---|---|---|---|---|---|
| Example 1 | TEA (0.1) | SA (0.5) | 15 | 0.20 | A | S-I: A | A |
| Example 2 | TEA (0.1) | NBA (0.7) | 16 | 0.20 | A | S-III: A | A |
| Example 3 | TMA (0.2) | SA (0.5) | 20 | 0.20 | A | S-I: A | A |
| Example 4 | TMA (0.1) | NBA (0.2) | 16 | 0.20 | A | S-I: A<br>S-II: A | A |
| Example 5 | DMA (0.1) | PA (0.1) | 15 | 0.21 | A | S-I: A<br>S-II: A<br>S-III: A | A |

TABLE 1-continued

|  | Amine (parts) | Carboxylic acid (parts) | Sensitivity, mJ/cm$^2$ | Pattern resolution, μm | Fidelity to mask pattern | Adaptability to substrate | Post-exposure stability |
|---|---|---|---|---|---|---|---|
| Comparative Example 1 | TEA (0.1) | None | 14 | 0.23 | B | S-I: B | B |
| Comparative Example 2 | None | SA (0.5) | 5 | 0.30 | C | S-III: A | B |
| Comparative Example 3 | TEA (0.1) | SA (20.0) | 15 | 0.20 | B | S-III: A | A |

What is claimed is:

1. A chemical sensitization positive-working photoresist composition which comprises, in the form of a uniform solution in an organic solvent:
    (a) an acid-generating agent which is a compound capable of releasing an acid when irradiated with actinic rays in an amount on the range from 1 to 20 parts by weight;
    (b) a combination of:
        a first poly(hydroxystyrene)-based resin which is a poly(hydroxystyrene) resin having tert-butoxycarbonyl groups substituting for from 10 to 60% of the hydrogen atoms of the hydroxy groups in the poly(hydroxystyrene) resin; and a second poly(hydroxystyrene)-based resin which is a poly(hydroxystyrene) resin having alkoxyalkyl groups, of which the alkoxy group and the alkyl group each have 1 to 4 carbon atoms, substituting for from 10 to 60% of the hydrogen atoms of the hydroxy groups in the poly(hydroxystyrene) resin, in a weight proportion in the range from 10:90 to 70:30,
        in an amount of 100 parts by weight;
    (c) an amine compound in an amount in the range from 0.01 to 1% by weight based on the amount of component (b); and
    (d) a carboxylic acid compound in an amount in the range from 0.01 to 5% by weight based on the amount of component (b).

2. The chemical sensitization positive-working photoresist composition as claimed in claim 1 in which the acid-generating agent as the component (a) is a compound selected from the group consisting of: bis(sulfonyl) diazomethane compounds, sulfonylcarbonyl alkane compounds, sulfonylcarbonyl diazomethane compounds, nitrobenzyl sulfonate compounds, ester compounds between a polyhydroxy compound and an aliphatic or aromatic sulfonic acid compound and onium salt compounds.

3. The chemical sensitization positive-working photoresist composition as claimed in claim 1 in which the amine compound as the component (c) is selected from the group consisting of aliphatic amine compounds, aromatic amine compound and heterocyclic amine compounds.

4. The chemical sensitization positive-working photoresist composition as claimed in claim 3 in which the amine compound as the component (c) is an aliphatic amine compound.

5. The chemical sensitization positive-working photoresist composition as claimed in claim 4 in which the aliphatic amine is triethylamine.

6. The chemical sensitization positive-working photoresist composition as claimed in claim 1 in which the carboxylic acid compound as the component (d) is an aromatic carboxylic acid.

7. The chemical sensitization positive-working photoresist composition as claimed in claim 6 in which the aromatic carboxylic acid is salicylic acid.

8. The chemical sensitization positive-working photoresist composition as claimed in claim 1 in which the amount of the component (d) is in the range from twice to 20 times by weight of the amount of the component (c).

* * * * *